(12) United States Patent
Efthivoulidis et al.

(10) Patent No.: US 10,693,474 B1
(45) Date of Patent: Jun. 23, 2020

(54) PLL FILTER HAVING A CAPACITIVE VOLTAGE DIVIDER

(71) Applicant: Infineon Technologies AG, Neubiberg (DE)

(72) Inventors: George Efthivoulidis, Graz (AT); Peter Thurner, Weissensee (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/276,329

(22) Filed: Feb. 14, 2019

(51) Int. Cl.
*H03L 7/093* (2006.01)
*H03H 7/06* (2006.01)
*H02M 3/07* (2006.01)

(52) U.S. Cl.
CPC ............. *H03L 7/093* (2013.01); *H02M 3/07* (2013.01); *H03H 7/06* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 5,663,675 A * | 9/1997 | O'Shaughnessy | ..... | H03H 11/04 327/100 |
| 5,889,439 A * | 3/1999 | Meyer | ..................... | H03L 7/093 327/156 |
| 6,891,412 B1 | 5/2005 | Jones et al. | | |
| 8,305,155 B2 * | 11/2012 | Yamaguchi | ............... | H03L 7/08 327/156 |
| 2009/0224839 A1 | 9/2009 | Schlueter et al. | | |
| 2010/0253438 A1 * | 10/2010 | Yamaguchi | ............... | H03L 7/08 331/34 |
| 2011/0221490 A1 | 9/2011 | Kimura | | |
| 2014/0084975 A1 * | 3/2014 | Tang | ..................... | H03L 7/0995 327/156 |
| 2014/0218082 A1 * | 8/2014 | Fan | ..................... | H03H 19/004 327/157 |
| 2015/0109035 A1 * | 4/2015 | Smith | ..................... | H03L 7/189 327/157 |
| 2015/0372682 A1 | 12/2015 | Alexeyev et al. | | |
| 2016/0020689 A1 * | 1/2016 | Chen | ..................... | H03L 7/0896 327/157 |
| 2016/0036485 A1 | 2/2016 | Nagaso et al. | | |
| 2017/0070192 A1 | 3/2017 | Martchovsky et al. | | |
| 2018/0053755 A1 | 2/2018 | Cho et al. | | |

FOREIGN PATENT DOCUMENTS

EP 2128987 B1 8/2012

* cited by examiner

*Primary Examiner* — Adam D Houston
(74) *Attorney, Agent, or Firm* — Murphy, Bilak & Homiller, PLLC (57) ABSTRACT

A phase-locked loop (PLL) includes a detector configured to generate an error signal based on a difference between a reference signal and an output signal, a charge pump configured to generate current pulses based on the error signal, a loop filter configured to generate a control voltage based on the current pulses, and a voltage-controlled oscillator (VCO) configured to generate the output signal at a frequency which is a function of the control voltage. The loop filter includes a capacitive voltage divider configured to reduce the control voltage from a range that falls within a voltage domain of the charge pump to a range that falls within a voltage domain of the VCO, the voltage domain of the charge pump being greater than the voltage domain of the VCO.

20 Claims, 5 Drawing Sheets

PLL FILTER HAVING A CAPACITIVE VOLTAGE DIVIDER

BACKGROUND

Phase-locked loops (PLLs) are widely used to generate an output signal having a phase and frequency related to that of an input signal. The voltage-controlled oscillator (VCO) of a PLL typically operates at a much higher frequency than the frequency of the input signal. Hence, the VCO of a PLL is typically designed using CMOS technology devices which support very high switching frequencies, e.g., in the GHz range or above. Such devices often have a relatively low operating voltage, e.g., 0.9V or lower to support such high switching frequencies. The charge pump tends to operate at a much lower frequency range, e.g., in the MHz range, and therefore is typically designed using devices having a higher operating voltage, e.g., 1.8V or higher so as to reduce noise sensitivity. For example, in automotive Radar systems which operate in the 76 to 81 GHz frequency range, an analog PLL is typically used to generate the frequency ramp. The VCO must cover a bandwidth of 4 GHz. The phase noise contributed by the loop filter of the PLL can be dominant, mainly because of the high VCO gain. These challenges increase the difficulty in designing a PLL with good noise performance, since the voltage range of the VCO is relatively small and noise performance becomes more important.

BiCMOS technology may be employed to integrate the charge pump, loop filter and VCO components of a PLL on the same die (chip). BiCMOS technology provides high frequency devices for the implementation of the VCO, but at a relatively higher supply voltage compared to low voltage CMOS technologies. In this case, the VCO gain is reduced and the phase noise contributed by loop filter is not dominant, although still important. This approach, however, is not compatible with low voltage CMOS technologies.

The phase noise contributed by the loop filter instead can be reduced by impedance scaling, i.e., by increasing the size of the capacitors and proportionally decreasing the size of the resistors included in the loop filter. With this approach, excessive capacitance area is needed to ensure the phase noise contributed by the loop filter remains at a satisfactory level below the VCO phase noise.

Hence, there is a need for an improved solution for integrating the charge pump, loop filter and VCO components of a PLL.

SUMMARY

According to an embodiment of a phase-locked loop (PLL), the PLL comprises: a detector configured to generate an error signal based on a difference between a reference signal and an output signal; a charge pump configured to generate current pulses based on the error signal; a loop filter configured to generate a control voltage based on the current pulses; and a voltage-controlled oscillator (VCO) configured to generate the output signal at a frequency which is a function of the control voltage, wherein the loop filter comprises a capacitive voltage divider configured to reduce the control voltage from a range that falls within a voltage domain of the charge pump to a range that falls within a voltage domain of the VCO, wherein the voltage domain of the charge pump is greater than the voltage domain of the VCO.

In one embodiment, the capacitive voltage divider comprises a first capacitor connected to a second capacitor at a voltage division node of the capacitive voltage divider and the VCO is coupled to the voltage division node of the capacitive voltage divider.

Separately or in combination, the loop filter may further comprise a resistive voltage divider in parallel with the capacitive voltage divider and the resistive voltage divider may comprise a first resistor in parallel with the first capacitor of the capacitive voltage divider and a second resistor in parallel with the second capacitor of the capacitive voltage divider.

Separately or in combination, the resistive voltage divider may be connected in parallel with the capacitive voltage divider in a fixed frequency mode of the PLL and disconnected from the capacitive voltage divider in a frequency ramp mode of the PLL.

Separately or in combination, the loop filter may be a $2^{nd}$ or higher order filter and the capacitive voltage divider may be coupled between a largest capacitor of the loop filter and an output of the loop filter.

Separately or in combination, the loop filter may be a passive filter.

Separately or in combination, the loop filter may be an active filter, a feedback path of the active filter may comprise a largest capacitor of the loop filter and a resistor, and the capacitive voltage divider may be coupled between the largest capacitor of the loop filter and an output of the loop filter.

Separately or in combination, values of the first and the second capacitors of the capacitive voltage divider may be chosen so as to reduce the control voltage by a 3-to-1 or 2-to-1 ratio.

Separately or in combination, values of the first and the second capacitors of the capacitive voltage divider may be chosen so as to reduce the control voltage from a range of 0V to 1.8V to a range of 0V to 0.9V.

Separately or in combination, a division ratio of the capacitive voltage divider may be configurable by switching between different values for at least one of the first and the second capacitors of the capacitive voltage divider.

Separately or in combination, at least one of the first and the second capacitors of the capacitive voltage divider may comprise two capacitors connected in series and one of the two capacitors connected in series may be configured to be shorted so as to change the division ratio of the capacitive voltage divider.

Separately or in combination, the loop filter may further comprise a resistive voltage divider in parallel with the capacitive voltage divider.

Separately or in combination, the resistive voltage divider may comprise a separate resistor in parallel with each capacitor of the capacitive voltage divider.

Separately or in combination, a division ratio of the capacitive voltage divider may be configurable to accommodate different modes of the PLL.

Separately or in combination, a division ratio of the capacitive voltage divider may be configurable to accommodate different Radar frequency ramp bandwidths.

Separately or in combination, a division ratio of the capacitive voltage divider and a division ratio of the resistive voltage divider may be configured to be switched simultaneously.

Separately or in combination, the resistive voltage divider may be connected in parallel with the capacitive voltage divider in a fixed frequency mode of the PLL and disconnected from the capacitive voltage divider in a frequency ramp mode of the PLL.

Separately or in combination, a division ratio of the capacitive voltage divider may be selected to optimize a total capacitance area of the loop filter for a specified noise performance, or to optimize noise performance for a specified capacitance area of the multi-order loop filter.

According to another embodiment of a PLL, the PLL comprises: a detector configured to generate an error signal based on a difference between a reference signal and an output signal; a charge pump configured to generate current pulses based on the error signal; a loop filter configured to generate a control voltage based on the current pulses; and a voltage-controlled oscillator (VCO) configured to generate the output signal at a frequency which is a function of the control voltage, wherein the loop filter comprises a first capacitor connected with a second capacitor to form a capacitive voltage divider, wherein the second capacitor of the capacitive voltage divider isolates a DC voltage level between first and second parts of the loop filter, to reduce the control voltage from a range that falls within a voltage domain of the charge pump to a range that falls within a voltage domain of the VCO, wherein the charge pump is configured to operate within the first voltage domain, wherein the VCO is configured to operate within the second voltage domain, wherein the second voltage domain is lower than the first voltage domain supply.

According to an embodiment of a method of operating a PLL, the method comprises: generating an error signal, by a detector of the PLL, based on a difference between a reference signal and an output signal; generating current pulses, by a charge pump of the PLL, based on the error signal; generating a control voltage, by a loop filter of the PLL, based on the current pulses; generating the output signal, by a voltage-controlled oscillator (VCO) of the PLL, at a frequency which is a function of the control voltage; operating the VCO within a first voltage domain and the charge pump within a second voltage domain greater than the first voltage domain; and reducing the control voltage from a range that falls within the second voltage domain to a range that falls within the first voltage domain by a capacitive voltage divider of the loop filter.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a PLL having a loop filter that includes a capacitive voltage divider which isolates the DC voltage level between first and second parts of the loop filter. The charge pump of the PLL is coupled to the first part of the loop filter and operates at a higher supply voltage, whereas the VCO of the PLL is connected to the second part of the loop filter and operates at a lower supply voltage. The capacitive voltage divider reduces the control voltage output by the loop filter from a range that falls within the voltage domain of the charge pump to a range that falls within the voltage domain of the VCO. With this approach, the resulting PLL has improved noise performance for a specified overall area of the system. The charge pump, loop filter and VCO of the PLL also may be integrated on the same semiconductor die and in the same CMOS or BiCMOS technology. The noise contributed by the first part of the loop filter, which is coupled to the charge pump, is scaled down by the capacitive voltage divider and may be reduced without excessively increasing the overall capacitance area of the loop filter. The noise contributed by the second part of the loop filter, which is coupled to the VCO, is not scaled. However, the noise contributed by the second part of the loop filter is relatively small compared to the noise contributed by the first part of the loop filter. Various embodiments of the loop filter with a capacitive voltage divider are described next in more detail and in which the loop filter may or may not include a resistive voltage divider in parallel with the capacitive voltage divider, and the loop filter may be a passive or active filter. The features of the various loop filter embodiments described herein may be combined with each other, unless specifically noted otherwise.

Figure 1:
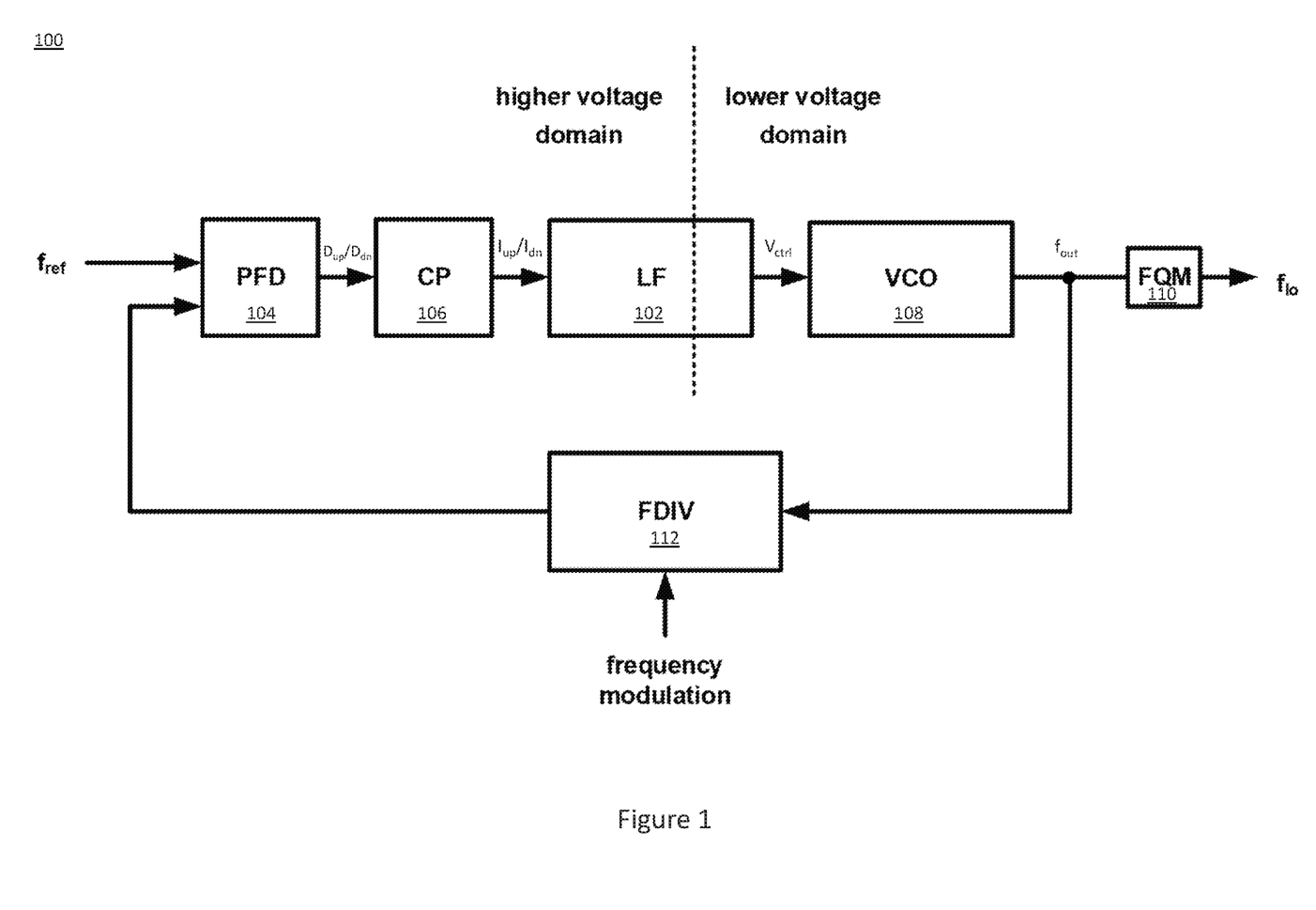
FIG. 1 illustrates a block diagram of an embodiment of a PLL which includes a loop filter having a capacitive voltage divider.

FIG. 1 illustrates an embodiment of a PLL 100 which includes a loop filter (LF) 102 having a capacitive voltage divider. The PLL 100 also includes a detector 104 for generating an error signal err ($D_{up}/D_{dn}$) based on the difference between a reference signal $f_{ref}$ and a signal generated by frequency division from an output signal $f_{lo}$ of the PLL 100. The error signal err typically includes two signals, $D_{up}$, and $D_{dn}$, each one for controlling the corresponding current pulse $I_{up}/I_{dn}$ generated by a charge pump (CP) 106 of the PLL 100. In one embodiment, the detector 104 is a phase-frequency detector (PFD). A phase detector such as an XOR (exclusive or) phase detector instead may be used as the detector 104. A PFD measures the phase and frequency difference between two signals, whereas a phase detector measures just the phase difference.

In each case, the charge pump 106 generates current pulses $I_{up}/I_{dn}$ based on the error signal err generated by the detector 104. That is, the charge pump 106 sources current pulses ($I_{up}$) into the loop filter 102 or sinks current pulses ($I_{dn}$) from the loop filter 102 for short durations with dead time in between individual pulses. The charge pump 106 may include a plurality of symmetrical or asymmetrical current sources. One current source is connected to a positive supply rail while the other current source is connected to a negative supply rail or ground. The current sources are separated by switch devices. The output of the detector 104 provides up ($D_{up}$) and down ($D_{dn}$) gating signals which turn on the switch devices, respectively. Whether the up gating signal ($D_{up}$) or the down gating signal ($D_{dn}$) is active determines whether the charge pump 106 sources current pulses ($I_{up}$) into the loop filter 102 or sinks current pulses ($I_{dn}$) from the loop filter 102.

The loop filter 102 generates a control voltage $V_{ctrl}$ based on the current pulses $I_{up}/I_{dn}$ generated by the charge pump 106. That is, the charge pump 106 converts up and down input pulses (err) from the detector 104 into corresponding current pulses $I_{up}/I_{dn}$ which charge ($I_{up}$) or discharge ($I_{dn}$) the loop filter 102 to yield a stable control voltage $V_{ctrl}$. Effectively, the loop filter 102 extracts the low frequency content of the error signal err ($D_{up}/D_{dn}$) and feeds the low frequency content in the form of voltage $V_{ctrl}$ to a VCO 108 of the PLL 100.

For example, for a passive loop filter 102 or for an active loop filter 102 with positive gain, a series of positive current pulses $I_{up}$ sourced by the charge pump 106 cause the loop filter 102 to output a steadily increasing voltage. For a series of negative pulses $I_{dn}$ sunk by the charge pump 106, the loop filter 102 outputs a steadily decreasing voltage. For an active loop filter 102 with negative gain, the opposite happens. In steady-state, the charge pump 106 generates alternating positive and negative current pulses (e.g., $I_{up}$, $I_{dn}$, $I_{up}$, $I_{dn}$, etc. or any sequence of current pulses for which the average is approximately zero) so on average the charge pump output is zero and the loop filter output does not change. The loop filter capacitors convert (smooth) the current pulses $I_{up}/I_{dn}$ from the charge pump 106 to a voltage $V_{ctrl}$. The loop filter capacitors absorb abrupt changes in the charge pump output to ensure the voltage $V_{ctrl}$ generated by the loop filter 102 is relatively smooth. The resistor and capacitor values of the loop filter 102 are selected based on the dynamics of entire loop.

The VCO 108 of the PLL 100 generates an output signal $f_{out}$ at a frequency which is a function of the control voltage $V_{ctrl}$ generated by the loop filter 102. Effectively, the VCO 108 produces an output signal $f_{out}$ which is continuously corrected by the low frequency content of the error signal err. The frequency of VCO 108 may be scaled-up, e.g., by a frequency multiplier (FQM) 110 and the feedback loop of the PLL 100 may include a frequency divider (FDIV) 112 for down-converting the VCO 108 e.g. by frequency division to a level suitable for the detector 104. The frequency divider 112 may include a pre-divider, a multi-modulus divider (MMD) and a Sigma-Delta modulator.

The VCO 108 typically operates at a much higher frequency than the detector 104 and the charge pump 106. For example, in automotive Radar applications, the oscillator frequency of the VCO 108 may be in the gigahertz range (e.g. 76 to 81 GHz) and the frequency of the detector 104 and the charge pump 106 may be in the megahertz range (e.g. 50 to 200 MHz). Hence, the charge pump 106 and VCO 108 are designed for different voltage domains, where the voltage domain of the charge pump 106 is greater than the voltage domain of the VCO 108. This way, the VCO 108 may be designed for a lower supply voltage since the VCO 108 generates a relatively high frequency signal e.g. in the 80 GHz range. The transistors and other semiconductor components which form the VCO 108 preferably are low-voltage devices since low-voltage devices provide better frequency response. Smaller devices are fast, but cannot support high voltages. Larger devices can operate at higher voltages, but with poorer frequency response. Hence, the VCO 108 is designed to operate in a lower voltage domain than the charge pump 106 so as to provide a desired high frequency output with sufficient noise performance.

The term "voltage domain" as used herein means the supply voltage for which a component of the PLL 100 is designed to operate safely. Signal levels for each PLL component may vary within some range limited by the corresponding voltage domain. For example, the charge pump 106 may be designed to operate at a supply voltage of 1.8V or even higher, e.g., 3.3V. The signal levels of the charge pump 106 may range from 0V to 1.8V in the first example, or from 0V to 3.3V in the second example. The VCO 108 is designed to operate at a lower supply than the charge pump 106, e.g., 0.9V or even lower, e.g., 0.8V. The signal levels of the VCO 108 may range from 0V to 0.9V in the first example, or from 0V to 0.8V in the second example. Still other voltage domain and signal level range combinations are contemplated.

In each case, the VCO 108 operates at a lower supply voltage than the charge pump 106. The loop filter 102 includes a capacitive voltage divider which reduces the control voltage $V_{ctrl}$ generated by the loop filter 102 from a range that falls within the voltage domain of the charge pump 106 to a range that falls within the voltage domain of the VCO 108. For example, if the charge pump 106 operates at a supply voltage of 1.8V and the VCO 108 operates at a supply of 0.9V, the capacitive voltage divider of the loop filter 102 reduces the control voltage $V_{ctrl}$ from a range of 0V to 1.8V to a range of 0V to 0.9V. This way, at least the detector 104, charge pump 106 and VCO 108 of the PLL 100 may be integrated on the same chip in the same semiconductor technology (e.g., CMOS, BiCMOS, etc.), with part of the chip having a lower-voltage domain at least for the VCO 108 and a higher-voltage domain for the other components.

In one embodiment, the PLL 100 may be operated by: generating an error signal err, by the detector 104 of the PLL 100, based on a difference between a reference signal $f_{ref}$ and a signal generated by frequency division from an output signal $f_{out}$ of the VCO 108; generating current pulses $I_{up}/I_{dn}$, by the charge pump 106 of the PLL 100, based on the error signal err; generating a control voltage $V_{ctrl}$, by the loop filter 102 of the PLL 100, based on the current pulses $I_{up}/I_{dn}$; generating the output signal $f_{out}$, by the VCO 108 of the PLL 100, at a frequency which is a function of the control voltage $V_{ctrl}$; operating the VCO 108 within a first voltage domain and the charge pump 106 within a second voltage domain greater than the first voltage domain; and reducing the control voltage $V_{ctrl}$ from a range that falls within the second voltage domain to a range that falls within the first voltage domain by the capacitive voltage divider of the loop filter 102.

Figure 2:
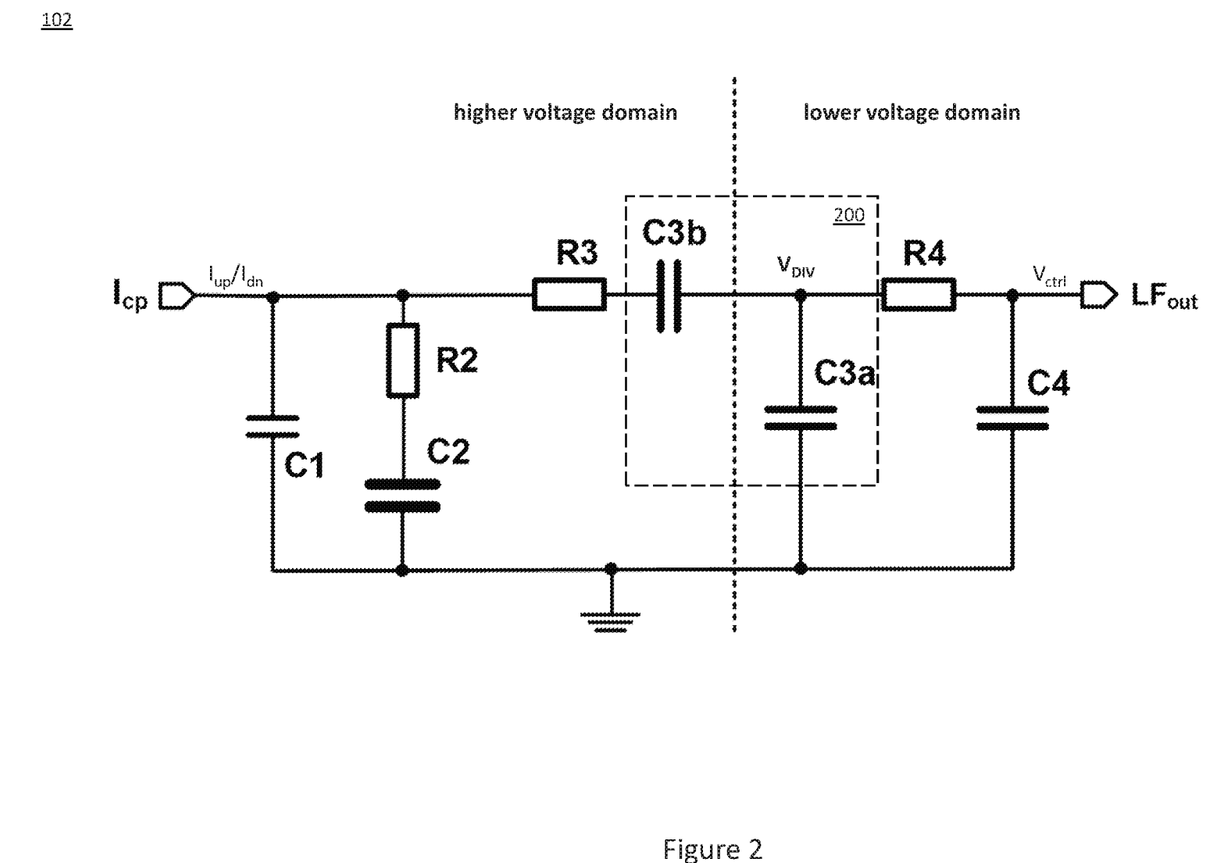
FIGS. 2 through 5 illustrate respective block diagrams of different embodiments of the loop filter of the PLL.

FIG. 2 illustrates an embodiment of the loop filter 102 of the PLL 100. The loop filter 102 is a multi-order filter, where the number of shunt capacitors included in the loop filter 102 determines the filter order. The loop filter 102 is $4^{th}$ order in FIG. 2. In general, the loop filter 102 is a $2^{nd}$ or higher order filter. The resistors R2, R3, R4 and capacitors C1, C2, C3a, C3b, C4 of the loop filter 102 determine the zeros and poles of the filter 102. According to the embodiment illustrated in FIG. 2, the loop filter 102 is a passive filter having only capacitive and resistive components. The loop filter 102 may instead be an active filter, as described later.

At least one of the capacitors of a typical loop filter architecture is replaced with a capacitive voltage divider 200. In FIG. 2, the third capacitor of a typical 4th order loop filter is replaced with a capacitive voltage divider 200 which includes capacitor C3a connected to capacitor C3b at a voltage division node $V_{DIV}$ of the capacitive voltage divider 200. According to the embodiment illustrated in FIG. 2, the capacitive voltage divider 200 is coupled between a largest capacitor C2 of the loop filter 102 and the output $LF_{out}$ of the loop filter 102. The capacitive voltage divider 200 may instead be placed in a different position within the loop filter 102, e.g., by replacing capacitor C1 or C4 in FIG. 2. In one embodiment, the capacitors C1, C2, C3a, C3b, C4 of the loop filter 102 are implemented as metal capacitors in a semiconductor chip which also includes at least the charge pump 106 and the VCO 108 of the PLL 100.

The VCO 108 of the PLL 100 is coupled to the voltage division node $V_{DIV}$ of the capacitive voltage divider 200 through the output $LF_{out}$ of the loop filter 102. Capacitor C3b of the capacitive voltage divider 200 isolates the DC voltage level between first and second parts of the loop filter 102, to reduce the control voltage $V_{ctrl}$ at the output $LF_{out}$ of the loop filter 102 from a range that falls within the voltage domain of the charge pump 106 to a range that falls within the voltage domain of the VCO 108. In one embodiment, the values of the capacitors C3a, C3b of the capacitive voltage divider 200 are chosen so as to reduce the control voltage $V_{ctrl}$ at the output $LF_{out}$ of the loop filter 102 by a 3-to-1 ratio. In another embodiment, the values of the capacitors C3a, C3b of the capacitive voltage divider 200 are chosen so as to reduce the control voltage $V_{ctrl}$ at the output $LF_{out}$ of the loop filter 102 by a 2-to-1 ratio. Still other voltage reduction ratios are contemplated.

The division ratio of the capacitive voltage divider 200 may be selected to optimize the total capacitance area of the loop filter 102 (area of C1+C2+C3a+C3b+C4 in FIG. 2) for a specified noise performance of the PLL 100. The division ratio of the capacitive voltage divider 200 instead may be selected to optimize the noise performance for a specified capacitance area of the loop filter 102. Still other considerations may determine the division ratio of the capacitive voltage divider 200.

The division ratio of the capacitive voltage divider 200 may be fixed or configurable (adjustable). For example, the division ratio of the capacitive voltage divider 200 may be configurable to accommodate different modes of the PLL 100 such as fixed frequency mode during which the frequency of the PLL 100 remains fixed, frequency ramp mode during which the frequency of the PLL 100 is being ramped, etc. Specifically in the case of automotive Radar applications, the division ratio of the capacitive voltage divider 200 may be configurable to accommodate different Radar frequency ramp bandwidths. The division ratio of the capacitive voltage divider 200 may be configurable by switching between different values for at least one of the capacitors C3a, C3b of the capacitive voltage divider 200.

The capacitive voltage divider 200 of the loop filter 102 divides signal and noise (at the same time) from the higher-voltage domain of the charge pump 106 to the lower-voltage domain of the VCO 108. The noise contributed by the second part of the loop filter 102 which is coupled to the VCO 108 is not scaled, but this noise is small compared to the noise contributed by the first part of the loop filter 102 which is coupled to the charge pump 106. The dominant part of the loop filter noise contributed by resistor R2 of the loop filter 102 is reduced due to the voltage division provided by the capacitive voltage divider 200.

FIG. 2 includes a vertical dashed line to indicate the different voltage domains. The division ratio of the capacitive voltage divider 200 provides a desired voltage domain down conversion, and the output $LF_{out}$ of the loop filter 102 connects to the input of the VCO 108 so that the control voltage $V_{ctrl}$ generated by the loop filter 102 has signal levels which fall within a range defined by the lower voltage domain of the VCO 108. In one embodiment, the values of the capacitors C3a, C3b of the capacitive voltage divider 200 are chosen so as to reduce the control voltage $V_{ctrl}$ generated by the loop filter 102 from a range of 0V to 1.8V or 0V to 3.3V to a range of 0V to 0.9V or 0V to 0.8V. Still other signal level conversion ranges for the control voltage $V_{ctrl}$ generated by the loop filter 102 are contemplated.

Figure 3:
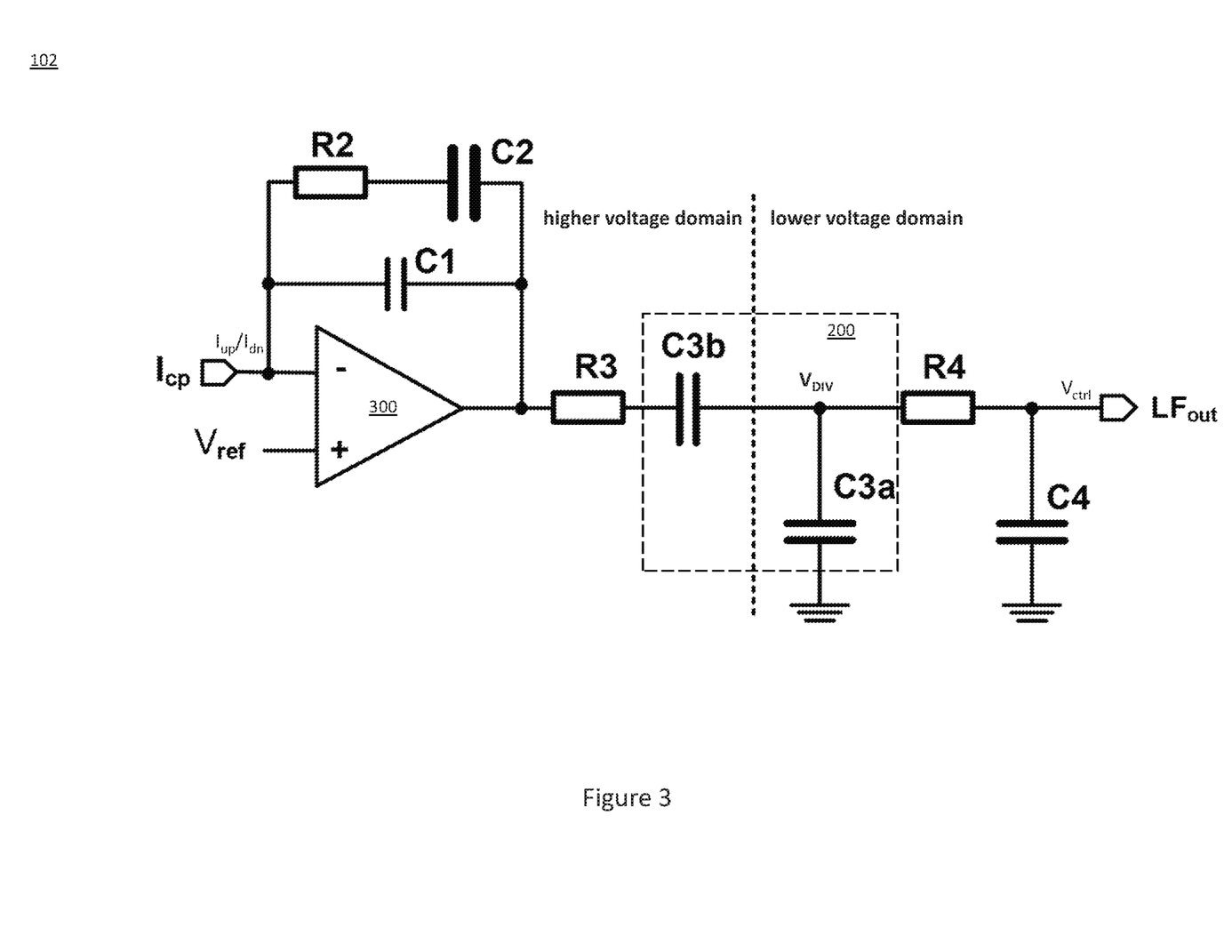

FIG. 3 illustrates another embodiment of the loop filter 102 of the PLL 100.

According to this embodiment, the loop filter 102 is an active filter having an operational amplifier 300. Compared to the purely passive filter embodiment of FIG. 2, capacitors C1 and C2 and resistor R2 are absorbed into the feedback path of the operational amplifier 300 in FIG. 3. The input current pulses $I_{up}/I_{dn}$ are smoothed and converted to voltage by the operational amplifier 300 and the elements in its feedback loop, and further smoothed by the remaining elements of the loop filter 102. The capacitive voltage divider 200 is coupled between the largest capacitor C2 of the loop filter 102 and the output $LF_{out}$ of the loop filter 102 in FIG. 3. Like the embodiment illustrated in FIG. 2, the third capacitor from the loop filter input $I_{cp}$ is replaced with the capacitive voltage divider 200 which includes capacitor C3a connected to capacitor C3b at the voltage division node $V_{DIV}$ of the capacitive voltage divider 200. As previously described herein, the capacitive voltage divider 200 may be placed in a different position within the loop filter 102, e.g., by instead replacing capacitor C4 in FIG. 3 with the capacitive voltage divider 200.

Figure 4:
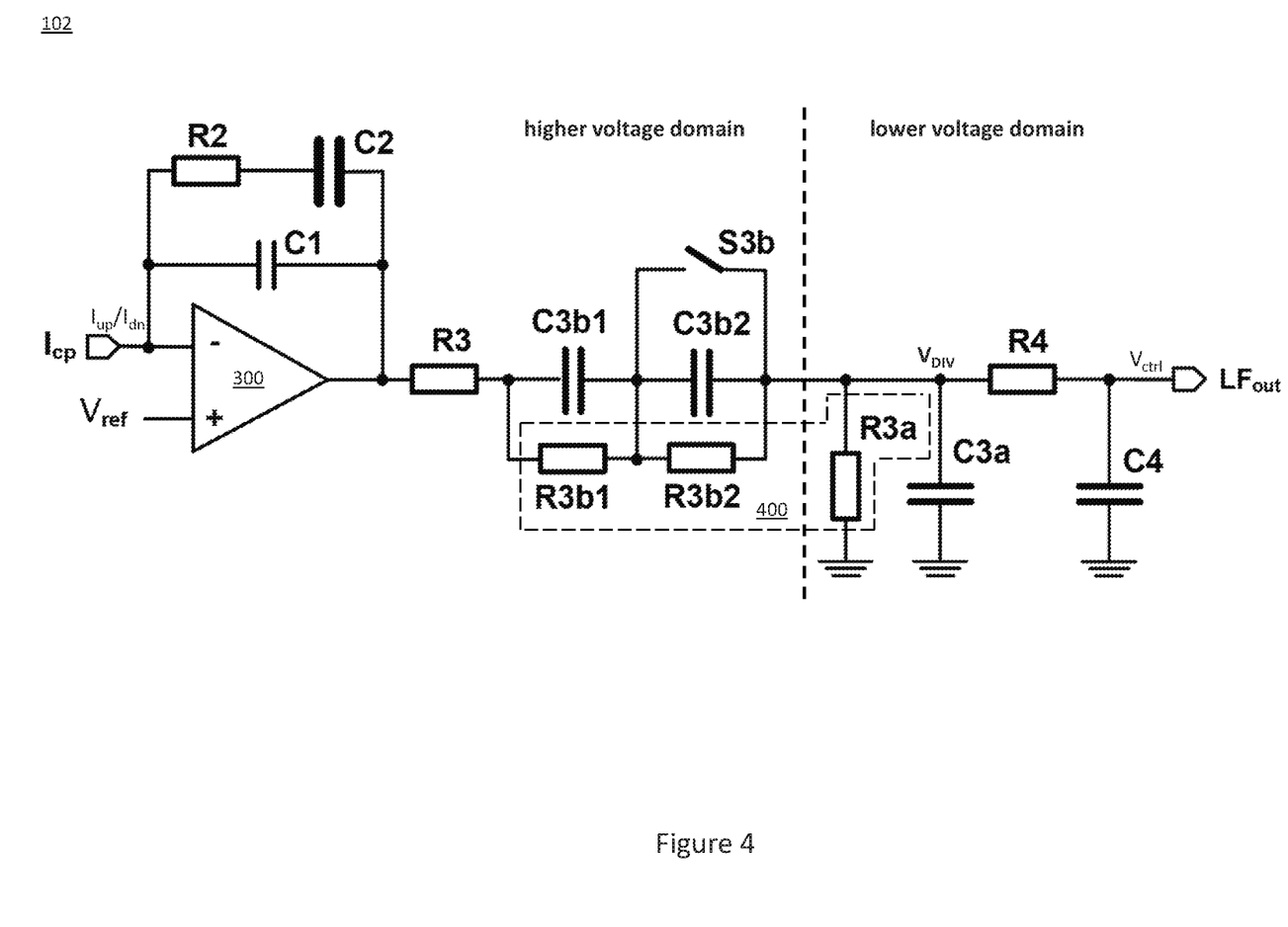

FIG. 4 illustrates another embodiment of the loop filter 102 of the PLL 100. The embodiment shown in FIG. 4 is similar to the embodiment shown in FIG. 3. Different, however, at least one of the capacitors of the capacitive voltage divider 200 is implemented as two capacitors connected in series and one of the two capacitors connected in series is configured to be shorted so as to change the division ratio of the capacitive voltage divider 200.

In FIG. 4, capacitor C3b of the capacitive voltage divider 200 is implemented as two capacitors C3b1, C3b2 connected in series and capacitor C3b2 is configured to be shorted so as to change the division ratio of the capacitive voltage divider 200. In one embodiment, capacitor C3b2 may be shorted via a switch device S3b such as a transistor. Capacitor C3a of the capacitive voltage divider 200 may instead be implemented as two capacitors connected in series with one of the two capacitors connected in series being configured to be shorted so as to change the division ratio of the capacitive voltage divider 200. In still another embodiment, both capacitors C3a, C3b of the capacitive voltage divider 200 may be implemented as two capacitors connected in series with one of the two capacitors connected in series being configured to be shorted in each case so as to change the division ratio of the capacitive voltage divider 200. In still another embodiment, either capacitor C3a or capacitor C3b, or both capacitors C3a and C3b of the capacitive voltage divider 200 may be implemented as two capacitors connected in parallel with one of the two capacitors connected in parallel being configured to be disconnected so as to change the division ratio of the capacitive divider 200. Either or both capacitors C3a, C3b of the capacitive voltage divider 200 of the passive loop filter 102 shown in FIG. 2 may be implemented in the same or similar manner, so that the division ratio of the capacitive voltage divider 200 is configurable.

The loop filter 102 may also include a resistive voltage divider 400 in parallel with the capacitive voltage divider 200 formed by capacitor C3a, capacitor C3b1 and capacitor C3b2. In FIG. 4, the resistive voltage divider 400 includes a separate resistor R3a, R3b1, R3b2 in parallel with each capacitor C3a, C3b1, C3b2 of the capacitive voltage divider 200. Resistor R3b2 of the resistive voltage divider 400 in parallel with capacitor C3b2 of the capacitive voltage divider 200 may be bypassed (shorted) simultaneously via switch device S3b. As explained above, a different and/or additional capacitor of the capacitive voltage divider 200 may be shorted via a corresponding switch device and hence each corresponding resistor of the resistive voltage divider 400 may also be shorted via the respective switch device. With such a switch device arrangement, the division ratio of the capacitive voltage divider 200 and the division ratio of the resistive voltage divider 400 may be switched simultaneously.

Figure 5:
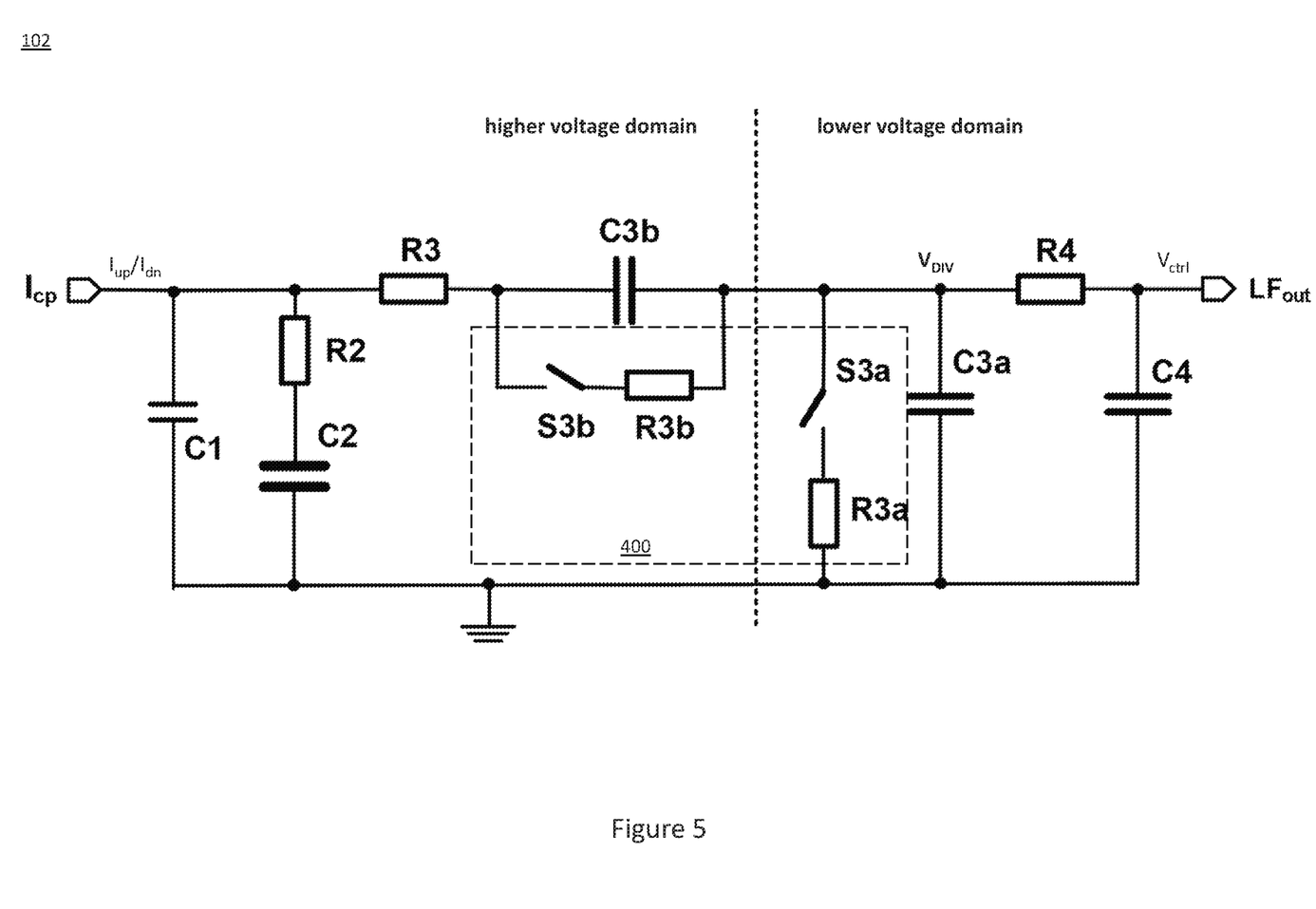

FIG. 5 illustrates an embodiment of the loop filter 102 in FIG. 2 modified to include the resistive voltage divider 400 in parallel with the capacitive voltage divider 200 formed by capacitor C3a and capacitor C3b. The resistive voltage divider 400 includes resistor R3a in parallel with capacitor C3a of the capacitive voltage divider 200 and resistor R3b in parallel with capacitor C3b of the capacitive voltage divider 200. A switch device S3a, S3b such as a transistor may be connected in series with each resistor R3a, R3b of the resistive voltage divider 400 so that the resistive voltage divider 400 may be switchably disconnected from the capacitive voltage divider 200. In one embodiment, the resistive voltage divider 400 is connected in parallel with the capacitive voltage divider 200 in a fixed frequency mode of the PLL 100 in which phase noise requirements are relaxed, by closing the switch device S3a, S3b and disconnected from the capacitive voltage divider 200 in a frequency ramp mode of the PLL 100 by opening the switch device S3a, S3b.

A resistive voltage divider 400 which may be switchably disconnected from the capacitive voltage divider 200 may be particularly advantageous in automotive Radar applications which typically employ a frequency-modulated continuous-wave (FMCVV) radar system. In FMCW radar systems, the PLL 100 implements successive frequency modulation ramps of the oscillator output frequency, e.g., 100 or 200 ramps or more. A multi-modulus divider (MMD) included in the PLL 100 is continuously ramped with different values so the oscillator frequency output is linearly modulated. Continuously applying different values to the MMD enables a frequency modulation ramp. Each frequency modulation ramp begins at a first frequency and ends at a second frequency.

However, there is a risk of a floating net because of the capacitive divider 200 in the loop filter 200. For example, in FIGS. 1 through 5, the left-hand side of the loop filter 102 can operate at a different DC offset than the right-hand side of the loop filter 102 because of the capacitive divider 200. Particularly, the series capacitor C3b (or C3b1 and C3b2 in FIG. 4) of the capacitive voltage divider 200 isolates the DC voltage level between the two parts of the loop filter 102. If the DC voltage of the series capacitor C3b (or C3b1 and C3b2 in FIG. 4) of the capacitive voltage divider 200 is not set, and if that the PLL 100 has been locked, the loop filter output voltage $V_{ctrl}$ will be fixed by the loop according to the target frequency, but the voltage level at the left-hand side of capacitor C3b (or C3b1 and C3b2 in FIG. 4) of the capacitive voltage divider 200 is undefined. Leakage current can cause the floating net to move around without any or little resistance from the loop filter 102. To mitigate against such a floating net while the PLL 100 generates a sequence of frequency ramps with a controllable slope, the resistive voltage divider 400 may be connected in parallel with the capacitive voltage divider 200 in the fixed frequency mode of the PLL 100 and disconnected from the capacitive voltage divider 200 in the frequency ramp mode of the PLL 100.

According to this embodiment, the DC level of capacitor C3b (or C3b1 and C3b2 in FIG. 4) of the capacitive voltage divider 200 is defined statically by adding the resistive voltage divider 400 in parallel with the capacitive voltage divider 200, e.g., as shown in FIGS. 4 and 5. The addition of the resistive voltage divider 400 allows the PLL 100 to lock at a fixed frequency for an indefinite time (fixed frequency mode), even in the presence of leakage current. The resistor values of the resistive voltage divider 400 may be selected to provide the desired voltage division ratio, e.g., 2:1, 3:1, etc. The resistor values of the resistive voltage divider 400 may be selected to be high enough so as to not degrade noise performance of the system. As described above, the resistive voltage divider 400 may be connected in parallel with the capacitive voltage divider 200 in fixed frequency mode and disconnected from the capacitive voltage divider 200 in frequency ramp mode during which noise performance is more critical. In one embodiment, the resistor values of the resistive voltage divider 400 are in the Megaohm (MΩ) range or larger, e.g., 1 MΩ or larger. The selection of the resistor values is a trade-off. Smaller parallel resistors provide better control of the DC level of capacitor C3b (or C3b1 and C3b2 in FIG. 4) of the capacitive voltage divider 200, but add more noise.

The embodiments described herein provide improved PLL noise performance, and enable automotive Radar applications, particularly in CMOS technologies. The overall noise is a critical system parameter, and the PLL phase noise is the dominant component of the overall system noise. Seen differently, for a given specified PLL phase noise performance, the embodiments described herein enable an implementation in low voltage CMOS technologies.

In yet additional embodiments, the active loop filter illustrated in FIG. 3 may be implemented together with the resistive divider but without the switchable capacitor. A switchable capacitor, e.g. as shown in FIG. 4, may be used for a passive loop filter, e.g., of the kind shown in FIG. 2. Switchable resistors may be used in the loop filter illustrated in FIG. 4, e.g., by using a series switch for each of the 3 resistors R3a, R3b1, R3b2 shown in FIG. 4.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A phase-locked loop (PLL), comprising:
  a detector configured to generate an error signal based on a difference between a reference signal and an output signal;
  a charge pump configured to generate current pulses based on the error signal;
  a loop filter configured to generate a control voltage based on the current pulses; and
  a voltage-controlled oscillator (VCO) configured to generate the output signal at a frequency which is a function of the control voltage,
  wherein the loop filter comprises a capacitive voltage divider configured to reduce the control voltage from a range that falls within a voltage domain of the charge pump to a range that falls within a voltage domain of the VCO, wherein the voltage domain of the charge pump is greater than the voltage domain of the VCO.

2. The PLL of claim 1, wherein the capacitive voltage divider comprises a first capacitor connected to a second capacitor at a voltage division node of the capacitive voltage divider, and wherein the VCO is coupled to the voltage division node of the capacitive voltage divider.

3. The PLL of claim 2, wherein the loop filter further comprises a resistive voltage divider in parallel with the capacitive voltage divider, and wherein the resistive voltage divider comprises a first resistor in parallel with the first capacitor of the capacitive voltage divider and a second resistor in parallel with the second capacitor of the capacitive voltage divider.

4. The PLL of claim 3, wherein the resistive voltage divider is connected in parallel with the capacitive voltage divider in a fixed frequency mode of the PLL and disconnected from the capacitive voltage divider in a frequency ramp mode of the PLL.

5. The PLL of claim 2, wherein the loop filter is a $2^{nd}$ or higher order filter, and wherein the capacitive voltage divider is coupled between a largest capacitor of the loop filter and an output of the loop filter.

6. The PLL of claim 5, wherein the loop filter is a passive filter.

7. The PLL of claim 2, wherein the loop filter is an active filter, wherein a feedback path of the active filter comprises a largest capacitor of the loop filter and a resistor, and wherein the capacitive voltage divider is coupled between the largest capacitor of the loop filter and an output of the loop filter.

8. The PLL of claim 2, wherein values of the first and the second capacitors of the capacitive voltage divider are chosen so as to reduce the control voltage by a 3-to-1 or 2-to-1 ratio.

9. The PLL of claim 2, wherein values of the first and the second capacitors of the capacitive voltage divider are chosen so as to reduce the control voltage from a range of 0V to 1.8V to a range of 0V to 0.9V.

10. The PLL of claim 2, wherein a division ratio of the capacitive voltage divider is configurable by switching between different values for at least one of the first and the second capacitors of the capacitive voltage divider.

11. The PLL of claim 10, wherein at least one of the first and the second capacitors of the capacitive voltage divider comprises two capacitors connected in series, and wherein one of the two capacitors connected in series is configured to be shorted so as to change the division ratio of the capacitive voltage divider.

12. The PLL of claim 11, wherein the loop filter further comprises a resistive voltage divider in parallel with the capacitive voltage divider, and wherein the resistive voltage divider comprises a separate resistor in parallel with each capacitor of the capacitive voltage divider.

13. The PLL of claim 10, wherein at least one of the first and the second capacitors of the capacitive voltage divider comprises two capacitors connected in parallel with one of the two capacitors connected in parallel being configured to be disconnected so as to change the division ratio of the capacitive voltage divider.

14. The PLL of claim 1, wherein a division ratio of the capacitive voltage divider is configurable to accommodate different modes of the PLL and/or different Radar frequency ramp bandwidths.

15. The PLL of claim 1, wherein the loop filter further comprises a resistive voltage divider in parallel with the capacitive voltage divider.

16. The PLL of claim 15, wherein a division ratio of the capacitive voltage divider and a division ratio of the resistive voltage divider are configured to be switched simultaneously.

17. The PLL of claim 15, wherein the resistive voltage divider is connected in parallel with the capacitive voltage divider in a fixed frequency mode of the PLL and disconnected from the capacitive voltage divider in a frequency ramp mode of the PLL.

18. The PLL of claim 1, wherein a division ratio of the capacitive voltage divider is selected to optimize a total capacitance area of the loop filter for a specified noise performance, or to optimize noise performance for a specified capacitance area of the multi-order loop filter.

19. A phase-locked loop (PLL), comprising:
a detector configured to generate an error signal based on a difference between a reference signal and an output signal;
a charge pump configured to generate current pulses based on the error signal;
a loop filter configured to generate a control voltage based on the current pulses; and
a voltage-controlled oscillator (VCO) configured to generate the output signal at a frequency which is a function of the control voltage,
wherein the loop filter comprises a first capacitor connected with a second capacitor to form a capacitive voltage divider,
wherein the second capacitor of the capacitive voltage divider isolates a DC voltage level between first and second parts of the loop filter, to reduce the control voltage from a range that falls within a voltage domain of the charge pump to a range that falls within a voltage domain of the VCO,
wherein the charge pump is configured to operate within the first voltage domain,
wherein the VCO is configured to operate within the second voltage domain,
wherein the second voltage domain is lower than the first voltage domain supply.

20. A method of operating a phase-locked loop (PLL), the method comprising:
generating an error signal, by a detector of the PLL, based on a difference between a reference signal and an output signal;
generating current pulses, by a charge pump of the PLL, based on the error signal;
generating a control voltage, by a loop filter of the PLL, based on the current pulses;
generating the output signal, by a voltage-controlled oscillator (VCO) of the PLL, at a frequency which is a function of the control voltage;
operating the VCO within a first voltage domain and the charge pump within a second voltage domain greater than the first voltage domain; and
reducing the control voltage from a range that falls within the second voltage domain to a range that falls within the first voltage domain by a capacitive voltage divider of the loop filter.

* * * * *